United States Patent
Takada

(10) Patent No.: US 11,445,648 B2
(45) Date of Patent: Sep. 13, 2022

(54) FEEDER

(71) Applicant: FUJI CORPORATION, Chiryu (JP)

(72) Inventor: Yukinori Takada, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 920 days.

(21) Appl. No.: 16/316,113

(22) PCT Filed: Jul. 8, 2016

(86) PCT No.: PCT/JP2016/070244
§ 371 (c)(1),
(2) Date: Jan. 16, 2019

(87) PCT Pub. No.: WO2018/008144
PCT Pub. Date: Jan. 11, 2018

(65) Prior Publication Data
US 2019/0215995 A1    Jul. 11, 2019

(51) Int. Cl.
*H05K 13/02* (2006.01)
*H05K 13/04* (2006.01)
*H05K 13/08* (2006.01)

(52) U.S. Cl.
CPC ......... *H05K 13/02* (2013.01); *H05K 13/0419* (2018.08); *H05K 13/086* (2018.08); *H05K 2203/0147* (2013.01)

(58) Field of Classification Search
CPC .. H05K 13/0084; H05K 13/02; H05K 13/021; H05K 13/0417; H05K 13/0419; H05K 13/043; H05K 13/086; H05K 2203/0147; Y10T 29/4913; Y10T 29/53478
See application file for complete search history.

(56) References Cited

U.S. PATENT DOCUMENTS

| 5,467,915 A | 11/1995 | Mattson | |
| 2007/0130756 A1* | 6/2007 | Watanabe | H05K 13/0812 29/721 |
| 2010/0071204 A1* | 3/2010 | Yonemitsu | H05K 13/0417 29/822 |
| 2015/0034714 A1* | 2/2015 | Koyanagi | G06K 7/10 235/375 |

FOREIGN PATENT DOCUMENTS

| JP | 10-40895 A | 2/1998 |
| JP | 2002-514987 A | 5/2002 |

(Continued)

OTHER PUBLICATIONS

International Search Report dated Aug. 9, 2016, in PCT/JP2016/070244, filed Jul. 8, 2016.

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A feeder including: a feeder main body with a supply position, the feeder being configured to supply an electronic component from an electronic component housing section that houses many of the electronic components one by one to the supply position; and a handle attached to an upper surface of the feeder main body, the handle being made from a flexible strip member so as to be able to change shape.

4 Claims, 6 Drawing Sheets

(56) References Cited

FOREIGN PATENT DOCUMENTS

| | | |
|---|---|---|
| JP | 2002-368484 A | 12/2002 |
| JP | 2010-114178 A | 5/2010 |
| JP | 2013-98375 A | 5/2013 |
| JP | 2014-60232 | 4/2014 |
| JP | 2014-60232 A | 4/2014 |
| JP | 2015-109352 A | 6/2015 |

* cited by examiner

[FIG. 1]
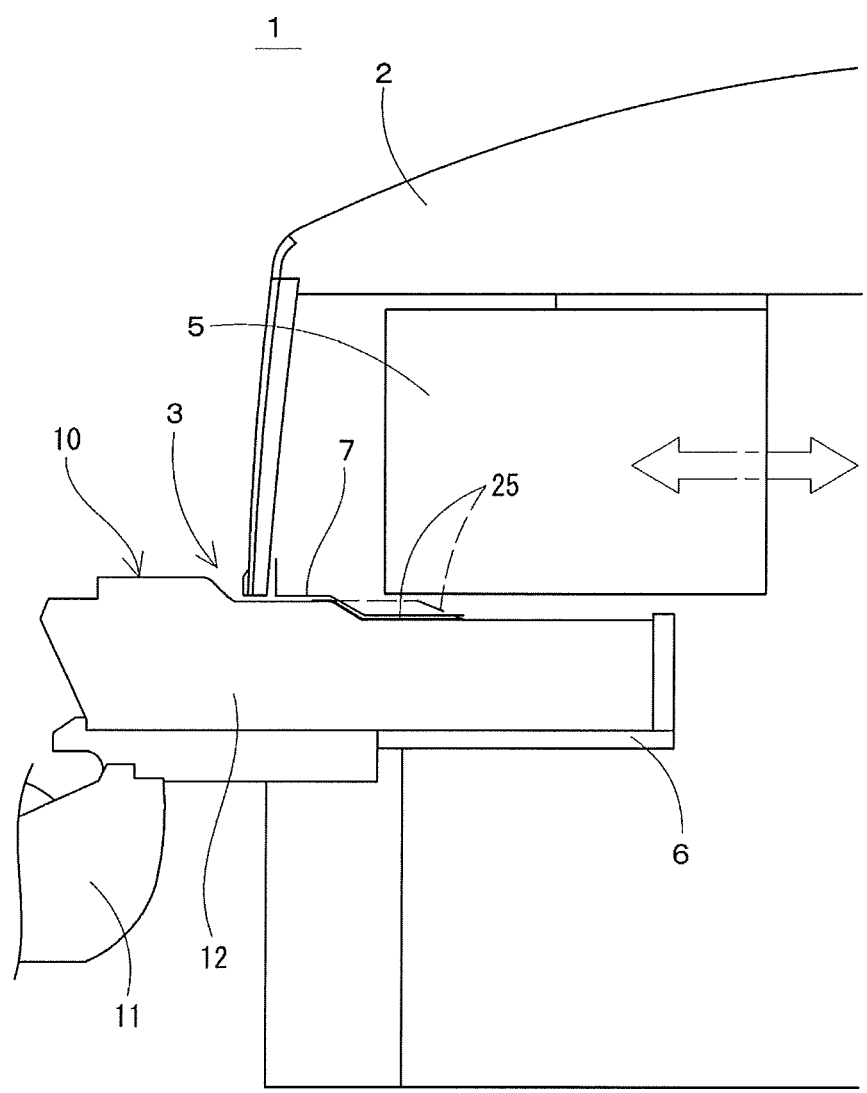

[FIG. 2]
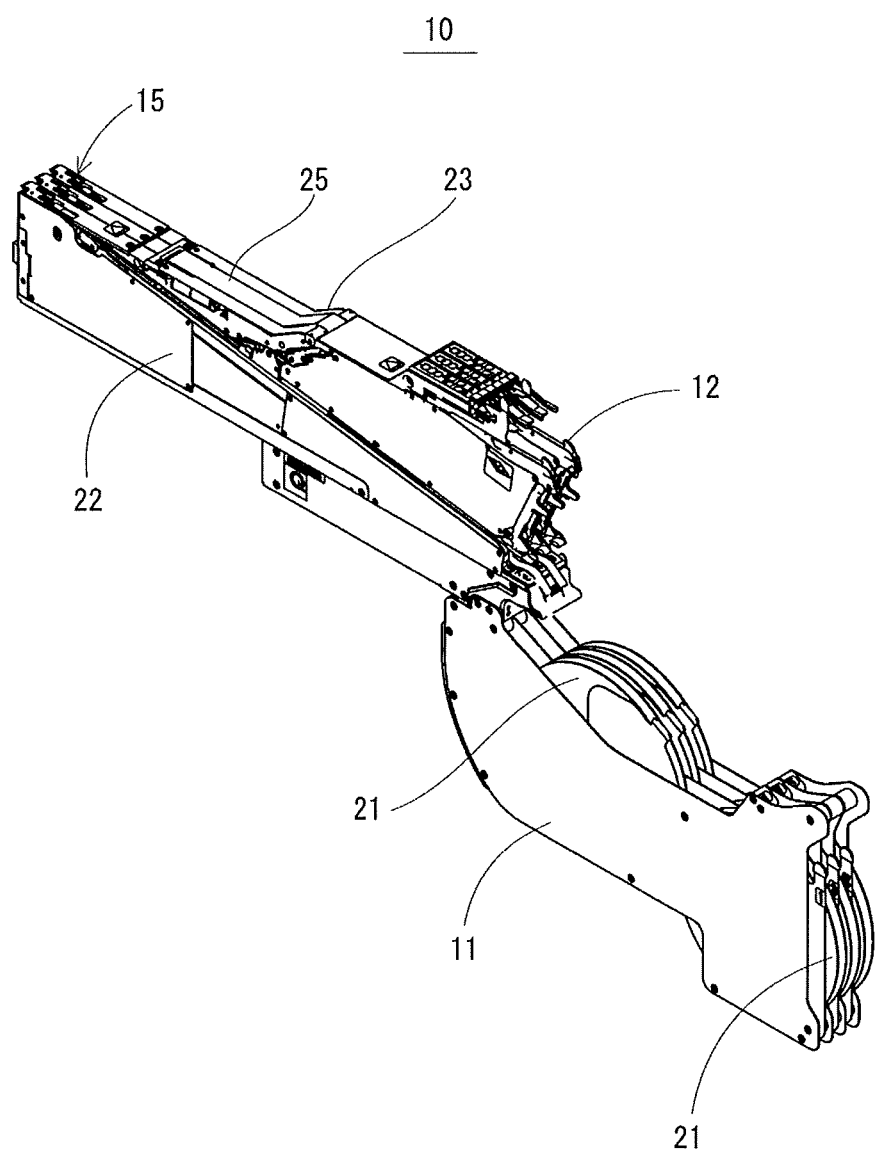

[FIG. 3]
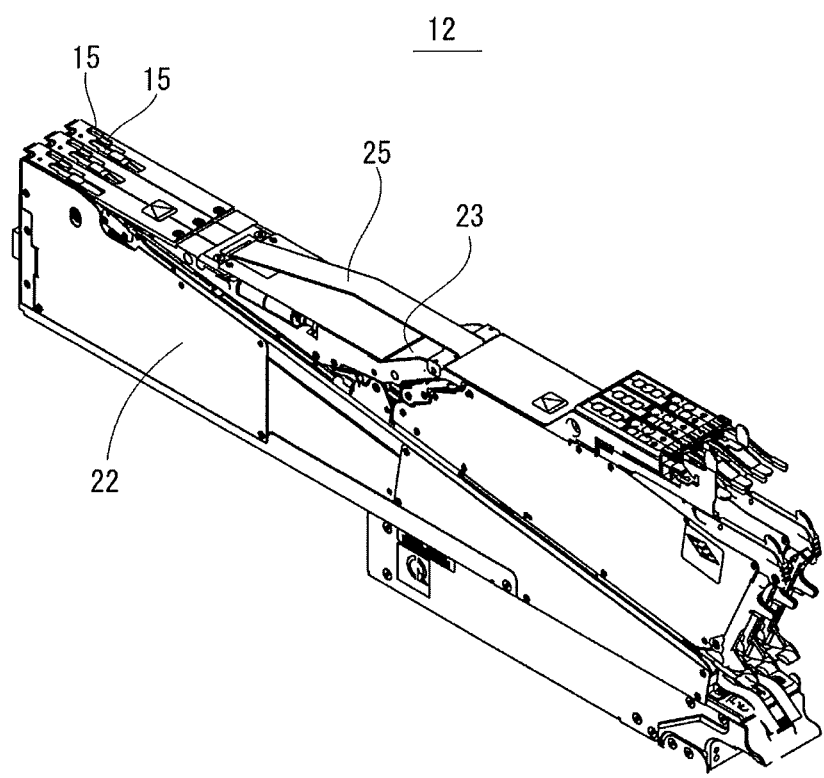

[FIG. 4]
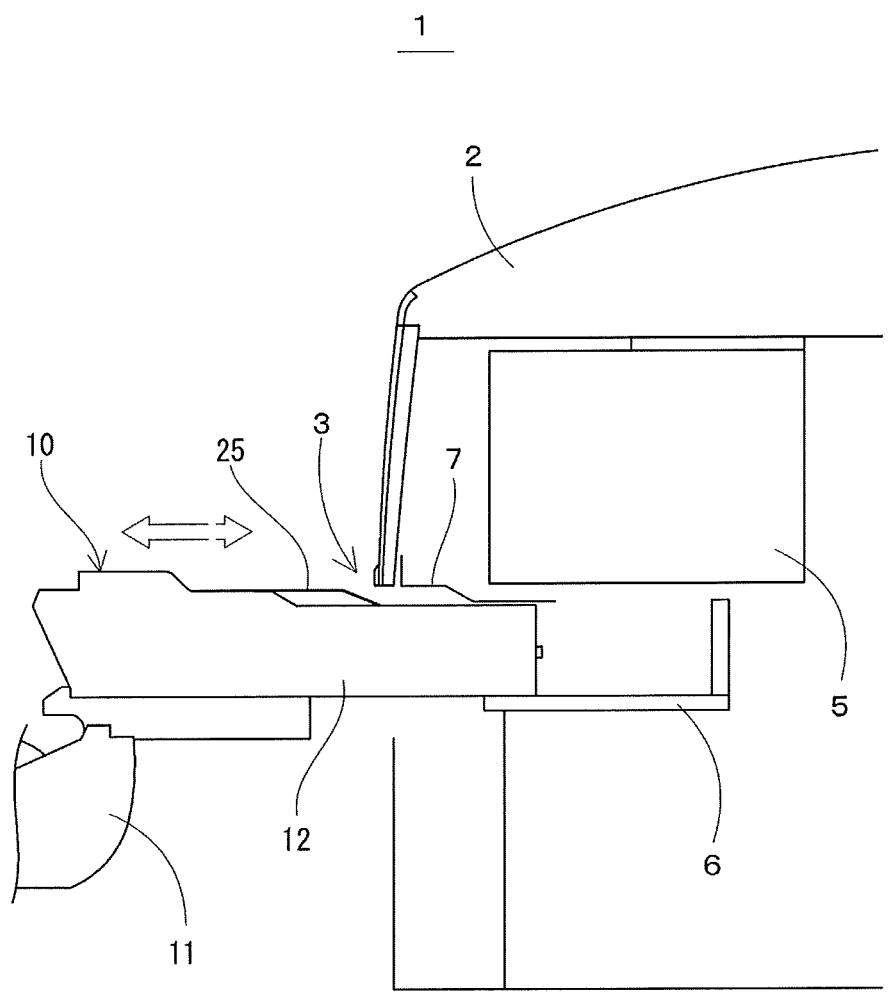

[FIG. 5]
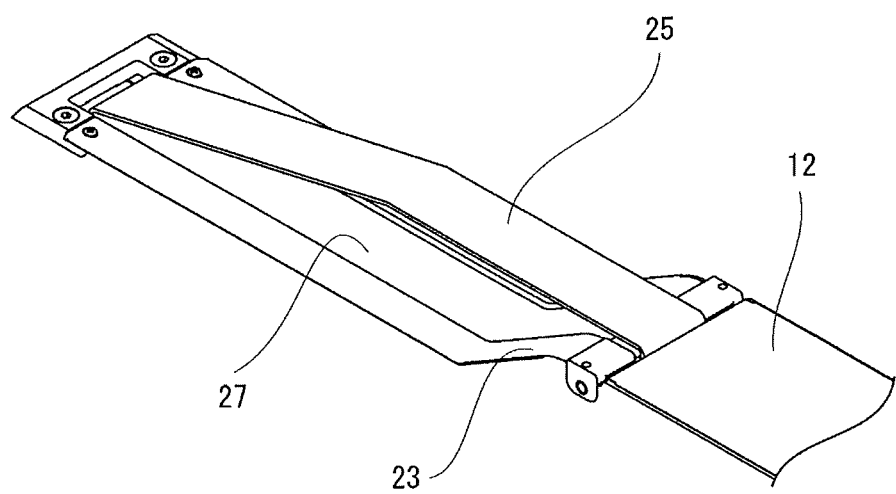

[FIG. 6]
(A)
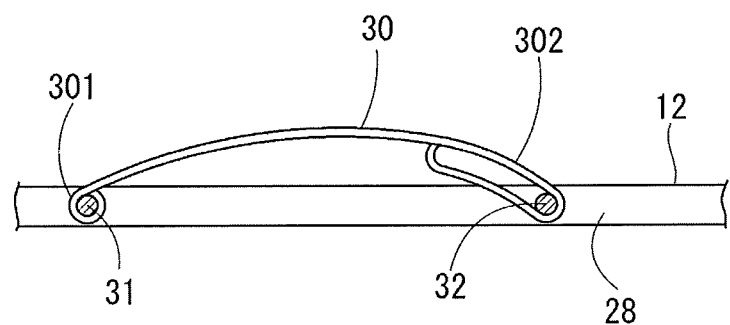
(B)
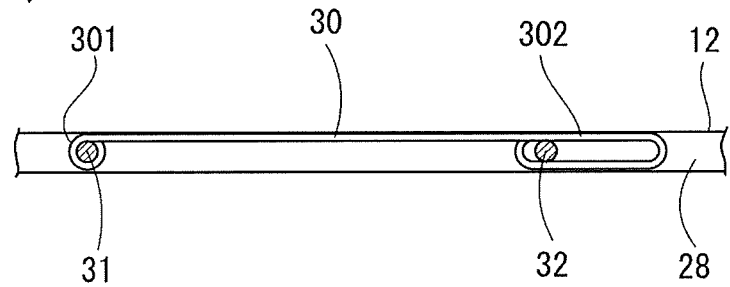

FEEDER

TECHNICAL FIELD

The present application relates to a feeder provided with a handle with a non-fixed shape.

BACKGROUND ART

An electronic component mounter that mounts electronic components on a circuit board is equipped with an electronic component supply device for supplying electronic components. Among such electronic component supply devices, for example, there is a tape feeder that supplies component supply tape housing electronic components by unwinding the tape from a tape reel. A tape feeding mechanism for feeding the component supply tape to a feeder main body is built into the tape feeder, and a reel holder that acts as an electronic component housing section is provided at the rear. Component supply tape used on such a tape feeder houses multiple electronic components at a fixed interval and is wound around a tape reel. The tape reel is attached to the reel holder so as to be freely rotatable.

A handle and an operation panel are provided on a rear upper section of the tape feeder. Various switches, LEDs, and the like are provided on the operation panel, and these are connected to a control board inside the feeder main body. With respect to the handle, as disclosed in patent literature 1, the handle is positioned at a front section of the operation panel, is formed as a long hole in the front-rear direction in a plate that configures the feeder main body, and a frame member that surrounds the long hole is fixed to the plate. Further, a handle disclosed in patent literature 2 is provided such that a horizontal bar with the same width dimension as the feeder main body protrudes to the rear from a rear section of the operation panel.

CITATION LIST

Patent Literature

Patent literature 1: JP-A-2015-109352
Patent literature 2: JP-A-2013-098375

BRIEF SUMMARY

Technical Problem

With conventional feeders, as in the first tape feeder above, the handle is formed in a rear section of the feeder main body. However, when the handle is formed at the rear of the feeder, when being carried, the feeder tends to be angled forward, which is very different to the angle required when loading and unloading the feeder to and from an electronic component mounter. Thus, when loading and unloading a feeder, because an operator must rearrange the orientation of the feeder before inserting the feeder and so on, there is a loss during handling operations. In particular, fora tape feeder of patent literature 2, because the feeder is relatively large and heavy, the orientation of the feeder when being held by the operator influences how easy it is to handle the feeder and perform operations such as loading and unloading. Feeders must be loaded into an extremely narrow space on an electronic component mounter, so it is difficult to freely change the position of the handle on the feeder.

The present disclosure solves these problems, and an object thereof is to provide a feeder with a handle with a non-fixed shape.

Solution to Problem

A feeder according to an embodiment of the present disclosure includes: a feeder main body with a supply position, the feeder being configured to supply an electronic component from an electronic component housing section that houses many of the electronic components one by one to the supply position; and a handle attached to an upper surface of the feeder main body, the handle being made from a flexible strip member.

Advantageous Effects

According to the present disclosure, by forming the handle from a flexible strip material, compared to a conventional handle that is a fixed shape, the shape of the handle is able to change, such that the position of the handle can be freely changed while leaving the shape of the feeder main body virtually unchanged.

BRIEF DESCRIPTION OF DRAWINGS

FIG. 1 is a simplified side view of a portion of an electronic component mounter.

FIG. 2 is a perspective view of an embodiment of a feeder.

FIG. 3 is a perspective view of a feeder main body that configures a portion of the feeder.

FIG. 4 is a simplified side view of a portion of the electronic component mounter illustrating a tape feeder being loaded and unloaded.

FIG. 5 is a perspective view showing an example of a changing shape of a handle structure.

FIG. 6 is a simplified view of the construction of the handle formed on a flat upper surface portion of the feeder main body.

DESCRIPTION OF EMBODIMENTS

An embodiment of a feeder according to the present disclosure is described below with reference to the figures. In the present embodiment, a description will be given using a tape feeder used on an electronic component mounter that mounts electronic components onto a circuit board as an example. FIG. 1 is a simplified side view of a portion of an electronic component mounter with a tape feeder of the present embodiment attached. Electronic component mounter 1 is lined up with other work machines in a width direction to configure a component mounting line for mounting specified electronic components on a circuit board. In the component mounting line, circuit boards are conveyed sequentially through the work machines with electronic component mounting work or the like being performed in each work machine.

As shown, electronic component mounter 1 is covered overall by machine cover 2, with a board opening section being formed in a side surface of cover 2 in the width direction (the direction perpendicular to the page surface), such that a circuit board can be passed between adjacent work machines through the board opening sections. Also, devices such as tape feeder 10 are loaded on electronic component mounter 1 via component opening section 3 formed in a front section of machine cover 2, such that components to be mounted on the circuit board can be supplied.

Electronic component mounter 1, when seen in the front-rear direction (left-right direction in the figure), as described above, includes a component supply section at which tape feeder 10 is loaded via component opening section 3 of a front portion, and a board conveyance section in a central portion for conveying circuit boards through the board opening sections. Mounting head 5 for performing electronic component mounting is arranged at a rear portion of the machine, mounting head 5 being configured to pick up an electronic component from a tape feeder 10 arranged on a front portion using a suction nozzle and mounting the electronic component on a conveyed circuit board. Accordingly, mounting head 5 is configured to be moveable in the front-rear direction of the machine as shown by the arrow. Mounting head 5 is shown conceptually in the figure.

FIG. 2 is a perspective view of tape feeder 10; FIG. 3 is a perspective view of a feeder main body that configures a portion of tape feeder 10. Tape feeder 10 is configured from reel holder 11 that holds multiple tape reels 21 on which is wound component supply tape, and feeder main body 12 provided with a tape feeding mechanism for pulling component supply tape from tape reel 21 in reel holder 11 and feeding the component supply tape to component supply position 15. The component supply tape wound on tape reel 21 holds multiple electronic components separated by a specified pitch in the lengthwise direction. Two upper and lower tape portions are separated at component supply position 15 of feeder main body 12 such that electronic components can be removed from the tape using a suction nozzle.

Reel holder 11 is configured to hold a total of six tape reels 21, three each at a front and rear position. Feeder main body 12 is formed with tape paths for guiding six component supply tapes fed from six tape reels 21 to a component supply position 15 set for each tape. In addition to tape paths inside box-shaped main body cover 22, tape feeding mechanisms for feeding the component supply tape along the tape paths are provided on feeder main body 12.

The tape feeding mechanisms are configured to handle six component tape reels, and are equipped inside main body cover 22 lined up in the width direction. Each tape feeding mechanism is equipped with sprocket on a swinging bracket and a motor or the like for rotating a set of gears that transmits rotation to a sprocket. By swinging the swinging bracket, the tape feeding mechanisms move vertically as one. In other words, by moving the tape feeding mechanism vertically, the teeth of the sprocket are switched between an engaged state in which the teeth are engaged with feeding holes formed continuously in the lengthwise direction of the component supply tape, and a release state in which the teeth are released from the feeding holes.

As shown in FIG. 1, feeder table 6 onto which devices such as feeders can be loaded and unloaded is provided in component opening section 3 of electronic component mounter 1. Accordingly, tape feeder 10 is attached to feeder table 6. Feeder table 6 is formed with multiple guide grooves that extend in the front-rear direction of the machine lined up next to each other in the width direction, and tape feeder 10 is formed with a protruding section on an underside of feeder main body 12 that engages with the guide groove when tape feeder 10 is inserted. Therefore, when performing exchange work and the like of tape feeder 10 at electronic component mounter 1, an operator arranges feeder main body 12 to be substantially horizontal and moves the feeder along the guide groove in the front-rear direction to load and unload tape feeder 10.

Electronic component mounter 1 is provided with internal cover 7 that covers an upper portion of tape feeder 10 inside component opening section 3. The gap between internal cover 7 and feeder main body 12 of tape feeder 10 is only a few millimeters. This is to maintain movement space for mounting head 5 that moves near tape feeder 10. Accordingly, the handle of an example conventional tape feeder is formed on rear end of feeder main body (the reel holder 11 side) that protrudes from component opening section 3 of electronic component mounter 1. If the handle with a conventional construction was formed on a portion inserted inside the machine, it would be necessary to change the shape of internal cover 7 to a shape bent upwards, which would restrict the movement range of mounting head 5.

With respect to this point, with the present embodiment, handle 25 is formed at a position on feeder main body 12 that is inserted into the machine, but is formed such that it is not necessary to change the shape of internal cover 7 provided conventionally in electronic component mounter 1. In other words, handle 25 of the present embodiment has a shape that can be changed to and from a shape used when an operator is carrying tape feeder 10 and a shape used when tape feeder 10 is attached inside component opening section 3. Specifically, handle 25 is made of a flexible belt material, for example, high-strength polyester, and as shown in FIGS. 2 and 3, the ends of handle 25 are attached to an upper surface of feeder main body 12.

Level difference portion 23 that is an angled surface is formed in the upper surface of feeder main body 12, and handle 25 is attached so as to straddle level difference portion 23 in the front-rear direction. In other words, one end of the flexible belt material of handle 25 is fixed to the upper level and the other end of the flexible belt material of handle 25 is attached to the lower level. As described above, because feeder main body 12 is configured including tape feeding mechanisms corresponding to the six component supply tapes, feeder main body 12 wide and its weight is biased towards the front. Therefore, the center of gravity of tape feeder 10 is near level difference portion 23 of feeder main body 12. Therefore, handle 25 straddling level difference portion 23 in the front-rear direction is attached to an upper section of tape feeder 10 at a position of the center of gravity of tape feeder 10.

In the stored state shown in FIG. 22, handle 25 made from a flexible belt member changes shape such that the entire length of handle 25 contacts the upper surface of feeder main body 12 that includes sloping level difference portion 23. Thus, when handle 25 is in the stored state, a section that protrudes from the upper surface of feeder main body 12 only protrudes by the thickness of handle 25, and as shown in FIG. 1, the thickness of the flexible belt member is equal to or less than the gap between internal cover 7 and feeder main body 12. Also, when being used, as shown in FIG. 3, handle 25 changes shape to be separated from the upper surface of feeder main body 12 such that a space is formed into which an operator can insert their fingers and hand.

Here, similar to FIG. 1, FIG. 4 is a simplified side view of a portion of the electronic component mounter, specifically illustrating a tape feeder being loaded and unloaded. As shown, feeder main body 12 of tape feeder 10 is positioned horizontally and is insert into and removed from component opening section 3 by being moved forwards or backwards in the direction of the double-sided arrow. For example, when loading the feeder by moving it to the right as shown in the figure, an operator holds handle 25 to support the tape feeder 10 and inserts the tip of feeder main body 12 into a guide groove on feeder table 16. After inserting the feeder into the guide groove, the operator releases handle 25 and changes to a position supporting the rear end of feeder main body 12 from below so as to insert the tape feeder 10 into the machine along the guide groove of feeder table 16.

Then, as shown in FIG. 1, as the tape feeder 10 becomes completely inserted, handle 25 that had a shape raised up as shown by the dashed line changes shape to the stored state as shown in FIG. 2 so as to fit inside internal cover 7. On the other hand, when tape feeder 10 is removed, when the state is changed from that in FIG. 1 to that in FIG. 4, tape feeder 10 is pulled out to a position at which handle 25 is outside the machine. Then, the operator changes the shape of handle 25 to insert their hand, and further pulls the tape feeder 10 out so that it is free and fully removed from electronic component mounter 1.

Thus, according to the present embodiment, because handle 25 is formed from a flexible belt member that has a changeable shape, unlike a conventional handle that has a fixed shape, even for electronic component mounter 1 for which a gap between a tape feeder 10 and an internal cover 7 is narrow, it is possible to freely change the position of handle 25. Thus, by arranging handle 25 in accordance with the center of gravity of tape feeder 10, an operator can hold the tape feeder 10 while maintaining balance in the front-rear direction, making handling easy.

Also, because an operator can carry tape feeder 10 with feeder main body 12 in a substantially horizontal state, it is extremely easy to insert and remove tape feeder 10 along a guide groove of feeder table 6. For example, when removing a feeder, at the moment when the support of feeder table 6 is lost, even if an operator is only holding the feeder with one hand, because the balance of the tape feeder 10 is good, unlike with a conventional feeder, there is no danger of the balance of the feeder being ruined the moment the feeder is removed.

Because handle 25 is configured from a cheap flexible belt member such as the polyester that is used for seat belts and the configuration for fixing the ends is easy, there is no need to largely redesign a conventional feeder main body, and the above effects can be achieved without incurring high costs. Also, because handle 25 is formed at level difference portion 23 on the upper surface of feeder main body 12, in the state shown in FIG. 3, there is sufficient space between the handle and the upper surface of feeder main body 12 such that the operator can easily hold the feeder.

Turning to FIG. 5, which is a perspective view showing an example of a changing shape of a handle structure. With this handle configuration, handle 25 uses the same flexible belt material of polyester. Further, storage groove 27 is formed on the feeder main body 12 side. That is, the handle achieves the effects that handle 25 achieves by changing shape to match the upper surface of feeder main body 12 while the flexible belt member of handle 25 is able to be inserted into storage groove 27. Accordingly, changes to the outer shape of feeder main body 12 due to handle 25 are curtailed even further.

Turning to FIG. 6, which is a simplified view of the construction of the handle formed on a flat upper surface portion of the feeder main body. Handle 30 is formed from a flexible belt material of polyester and has tubular attachment sections 301 and 302 formed at the ends; attachment bars 31 and 32 that are fixed to feeder main body 12 and separated from each other pass through attachment sections 301 and 302 respectively. Attachment section 301 is formed as a tube with approximately the same diameter as attachment bar 31 that is at the front side of the feeder; attachment section 302 is formed as a tube larger than attachment bar 32 that is at the rear side of the feeder.

Thus, in the usage state shown in FIG. 6(A), handle 30 is bent upwards such that a space is formed between handle 30 and feeder main body 12 into which an operator can insert their hand or fingers. On the other hand, in the storage state shown in FIG. 6(B), the position of attachment section 302 that is large is moved relative to attachment bar 32 such that handle 30 changes shape to be flat on the upper surface of feeder main body 12. In other words, even though the length of handle 30 is longer than the gap separating attachment bars 31 and 32, handle 30 can be made flat.

Accordingly, when the tape feeder 10 shown in FIG. 1 is attached to component opening section 3, even when handle 30 is in a usage state bent upwards as in FIG. 6(A), handle 30 changes shape to the storage state shown in FIG. 6(B) due to internal cover when moved relatively in the direction shown by the arrows. Further, because storage groove 28 is formed on an upper surface of feeder main body 12, and attachment bars 31 and 32 are fixed inside storage groove 28, handle 30 that is formed flat is stored inside storage groove 28.

The above describes an embodiment of the present disclosure, but embodiments are not limited to these and various changes may be employed without departing from the scope of the disclosure. For example, in an embodiment above descriptions are given using a tape feeder as an example, but the handle may be applied to a bulk feeder, a stick feeder, or the like. Also, in an embodiment above, descriptions are given with handle 25 positioned on tape feeder 10 at above the center of gravity of tape feeder 10, but this does not necessarily mean that the handle must be positioned on tape feeder 10 at above the center of gravity of tape feeder 10. So long as the handle is near the center of gravity, the feeder will not tilt a lot, which improves handling compared to a conventional feeder.

REFERENCE SIGNS LIST

1: electronic component mounter;
3: component opening section;
5: mounting head;
6: feeder table;
7: internal cover;
10: tape feeder;
11: reel holder;
12: feeder main body;
15: component supply position;
21: tape reel;
22: main body cover;
23: level difference portion;
25: handle

The invention claimed is:

1. A feeder comprising:
a feeder main body with a supply position, the feeder being configured to supply an electronic component from an electronic component housing section that houses many of the electronic components one by one to the supply position; and
a handle attached to an upper surface of the feeder main body, the handle being made from a flexible strip member, wherein
the feeder main body includes a level difference portion on the upper surface of the feeder main body for which a height varies in a front-rear direction, and the handle is attached such that a front end of the flexible strip member and a rear end of the flexible strip member straddle the level difference portion.

2. The feeder according to claim 1, wherein the handle is attached to an upper section of the feeder main body at a center of gravity of the feeder main body.

3. A feeder comprising:
a feeder main body with a supply position, the feeder being configured to supply an electronic component from an electronic component housing section that houses many of the electronic components one by one to the supply position; and
a handle attached to an upper surface of the feeder main body, the handle being made from a flexible strip member, wherein
the feeder main body includes a level difference portion on the upper surface of the feeder main body for which a height varies in a front-rear direction, and
the handle is attached such that a front end of the flexible strip member and a rear end of the flexible strip member straddle the level difference portion, wherein
the handle is configured such that the level difference portion includes a forward-angle portion that is angled forward, and the flexible strip member attached straddling the forward-angle portion is positioned in a storage state contacting the level difference portion so as to match a shape of the level difference portion.

4. The feeder according to claim 3, wherein the handle is attached to an upper section of the feeder main body at a center of gravity of the feeder main body.

* * * * *